(12) United States Patent
Yanagawa et al.

(10) Patent No.: US 6,897,087 B2
(45) Date of Patent: May 24, 2005

(54) METHOD FOR PRODUCING ORGANIC EL DISPLAY

(75) Inventors: Katsuhiko Yanagawa, Kanagawa (JP); Yukinori Kawamura, Kanagawa (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 10/611,880

(22) Filed: Jul. 3, 2003

(65) Prior Publication Data

US 2004/0046184 A1 Mar. 11, 2004

(30) Foreign Application Priority Data

| Jul. 3, 2002 | (JP) | 2002-195060 |
| Jul. 18, 2002 | (JP) | 2002-210186 |
| Oct. 10, 2002 | (JP) | 2002-297890 |

(51) Int. Cl.$^7$ ............................................. H01L 51/40
(52) U.S. Cl. ................................................ 438/99; 257/79
(58) Field of Search .............................. 438/99; 257/79

(56) References Cited

U.S. PATENT DOCUMENTS 6,528,951 B2 * 3/2003 Yamazaki et al. ....... 315/169.3
2001/0045558 A1 * 11/2001 Kawasaki et al. ............ 257/66
2002/0047568 A1 * 4/2002 Koyama ................... 315/169.3
2003/0227253 A1 * 12/2003 Seo et al. .................... 313/504

FOREIGN PATENT DOCUMENTS

| JP | 8-222369 | 8/1996 |
| JP | 2002-62845 | 2/2002 |
| JP | 2002-108285 | 4/2002 |

OTHER PUBLICATIONS

Patent Abstracts of Japan; Publication No. 11–251059 published on Sep. 17, 1999; Applicant: Sanyo Electric Co., Ltd.
Patent Abstracts of Japan; Publication No. 2000–077191 published on Mar. 14, 2000; Applicant: Sanyo Electric Co., Ltd.

* cited by examiner

Primary Examiner—Thao P. Le
(74) Attorney, Agent, or Firm—Manabu Kanesaka (57) ABSTRACT

An organic EL display device includes an organic EL light emitting element having the first electrode, an organic EL layer and the second electrode formed on a substrate; and a color conversion filter bonded to the organic EL light emitting element and having a color conversion filter layer formed on a transparent substrate. An outer sealing wall and an internal filling portion are formed between the organic EL light emitting element and the color conversion filter. A partition wall is formed between the outer sealing wall and the internal filling portion.

12 Claims, 6 Drawing Sheets

METHOD FOR PRODUCING ORGANIC EL DISPLAY

BACKGROUND OF THE INVENTION AND RELATED ART STATEMENT

The present invention relates to a method for manufacturing an organic Electro Luminescence (EL) display having a high resolution and excellent visibility and used for a wide range of applications such as a display of a mobile terminal or an industrial meter.

In recent years, the information technology has greatly advanced and the application of the technology has been expanding rapidly. In the field of a display device, there has been developed a high-resolution display device with a low power consumption and a high-speed response for meeting demands for mobility and displaying motion pictures.

In order to display a color image, a display device driven by a thin film transistor (TFT) has been developed. In such a device, it is difficult to provide a large opening in a system where light passes through a substrate having the TFT due to a shielding effect of a wiring portion. Therefore, there has been recently developed a top emission system in which the light radiates toward a side opposite to the substrate having the TFT.

In the top emission system, light emitting elements for the primary colors, i.e. red (R), green (G) and blue (B), are arranged separately in a matrix. Therefore, it is necessary to precisely arrange light emitting materials for the RGB over the matrix. Accordingly, it is difficult to manufacture such a system efficiently at a low cost. Moreover, the three light emitting materials have different luminescence characteristics and driving conditions. Therefore, it is still very difficult to obtain good color reproducibility for long time.

In a system where a backlight emits white light and a color filter is used to obtain the three primary colors, it is difficult to improve efficiency of the white backlight.

In a system called a color conversion system, fluorescent materials are arranged separately and absorb excited light so that the individual fluorescent element emits fluorescent light in multiple colors. It is perceived that only the color conversion system can provide a high-resolution and bright organic EL display with a combination of the top emission method using the TFT drive system. Japanese Patent Publications (Kokai) No. 11-251059 and No. 2000-77191 have disclosed such color display devices.

Figure 6:
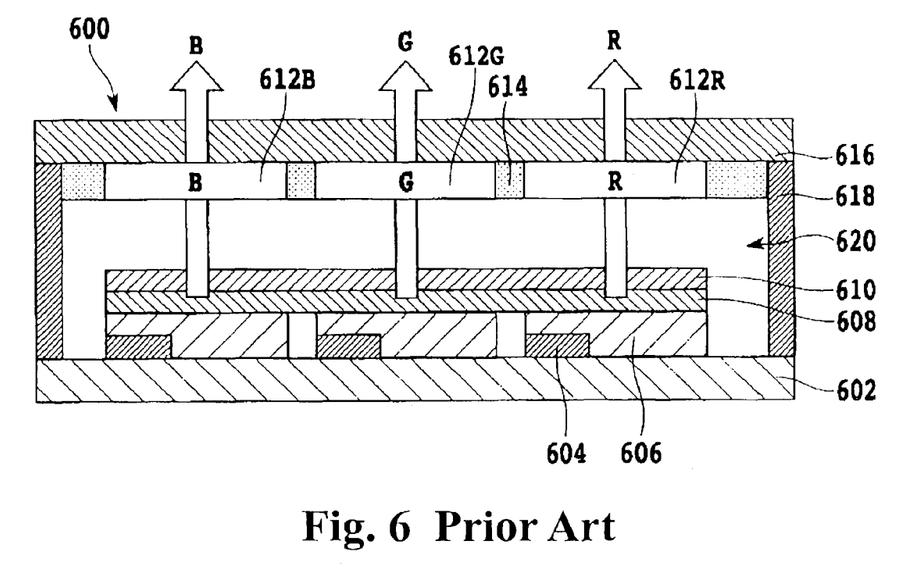
FIG. 6 is a cross sectional view showing a conventional organic EL display.

FIG. 6 is a view showing a structure of a conventional organic EL display. As shown in FIG. 6, TFTs 604, anodes 606, an organic EL layer 608 and a cathode 610 are formed on a substrate 602. A color conversion filter layer 612 and a black mask 614 are formed on a transparent substrate 616. An outer sealing wall 618 formed of a room temperature setting two-part epoxy adhesive is formed around a periphery of the substrate 602 to adhere to the transparent substrate 616. An internal space 620 is formed between the two substrates. In general, it takes long time, i.e. 24 hours, to cure the outer sealing wall 618 at the room temperature. Therefore, it is necessary to hold the device during the curing at the temperature after the anodes 606 and the color conversion filter layer 612 are positioned, so that the device is not shifted.

In the color display using the color conversion filter layer shown in FIG. 6, it is necessary to obtain a function of displaying high-resolution colors. The organic EL element needs to have long-term stability including the color reproducibility. A device needs to have a simple configuration and sealing structure to reduce time for manufacturing.

In the organic EL display shown in FIG. 6, it is necessary to accurately position (or align) the color conversion filter layer 612 and the anodes 606. An adhesive for the outer sealing wall 618 needs to remain stable without any state change such as a viscosity change or a gelation until the alignment is completed, so that the alignment can be adjusted freely. On the other hand, the adhesive needs to be cured in a short period of time once the alignment is completed.

In the organic EL display shown in FIG. 6, the internal space 620 is formed between the two substrates. As a result, the light emitted from the organic EL layer 608 is reflected at an interface between the internal space and the cathode, and at an interface between the internal space and the color conversion filter layer due to a large difference in refractive indexes. In order to solve this problem, it is possible to fill a transparent material with a high refractive index in the internal space 620. In this case, however, the transparent material filled in the internal space 620 contacts the adhesive of the outer sealing wall 618 before the adhesive is cured, thereby preventing the adhesive from curing completely.

In view of the aforementioned problems, the present invention has been conceived, and an object of the invention is to provide an organic EL display and a method of producing the organic EL display, in which a transparent material filled in an internal space does not contact an adhesive used for an outer sealing wall to prevent an insufficient curing of the outer sealing wall. It is also possible to precisely position (align) a color conversion filter layer and anodes, and to set the outer sealing wall promptly.

Another object of the invention is to provide a sealing structure and a sealing method for an organic EL display, in which light from an organic EL layer effectively transmits to a color conversion filter layer without reflecting inside the device, so that stable light emitting characteristics can be maintained over a long period of time while preventing moisture or the like from outside.

Further objects and advantages of the invention will be apparent from the following description of the invention.

SUMMARY OF THE INVENTION

According to the first aspect of the invention, an organic EL display device includes an organic EL light emitting element having the first electrode, an organic EL layer and the second electrode formed on a substrate; and a color conversion filter bonded to the organic EL light emitting element and including a color conversion filter layer formed on a transparent substrate. An outer sealing wall and an internal filling portion are formed between the organic EL light emitting element and the color conversion filter. A partition wall is formed between the outer sealing wall and the internal filling portion.

In the first aspect of the invention, the color conversion filter may include a flattening layer for covering the color conversion filter layer, and the partition wall may be formed at a portion other than a display region of the flattening layer. In a case of an active matrix drive, a thin film transistor may be formed over the substrate, and the first electrode is connected to the thin film transistor so that the thin film transistor drives the organic EL display. In a case of a passive matrix drive, the first electrode and the second electrode are individually formed in line patterns. The line patterns of the first electrode and the second electrode may extend perpendicular to each other. The outer sealing wall may be formed of an ultraviolet setting type adhesive. It is preferred that the internal filling portion has a refractive index of 1.2 to 2.5 and a visible light transmittance of 50% or higher relative to light having a wavelength of 400 to 800 nm.

According to the second aspect of the invention, a method for manufacturing an organic EL display comprises the steps of preparing an organic EL light emitting element by forming the first electrode, an organic EL layer and the second electrode on a substrate; preparing a color conversion filter by forming a color conversion filter layer on a transparent substrate; forming a partition wall around a periphery edge of the color conversion filter layer; forming an outer sealing wall at an outer side of the partition wall; filling inside of the partition wall with a filler; adhering the organic EL light emitting element to the color conversion filter at a predetermined position; and setting the outer sealing wall.

In the second aspect of the invention, in a case of an active matrix drive, a thin film transistor may be formed on the substrate, and the first electrode is connected to the thin film transistor, so that the thin film transistor drives the organic EL display. In a case of a passive matrix drive, the first electrode and the second electrode are individually formed in line patterns. The line patterns of the first electrode and the second electrode may extend perpendicular to each other. The outer sealing wall may be formed of an ultraviolet setting type adhesive. It is preferred that the internal filling portion has a refractive index of 1.2 to 2.5 and a visible light transmittance of 50% or higher relative to light having a wavelength of 400 to 800 nm.

According to the third aspect of the invention, a method for manufacturing an organic EL display comprises the steps of preparing an organic EL light emitting element by forming the first electrode, an organic EL layer and the second electrode on a substrate; preparing a color conversion filter by forming a color conversion filter layer and a flattening layer on a transparent substrate; forming a partition wall at an outer side of a display region of the flattening layer; forming an outer sealing wall at an outer side of the partition wall; filling inside of the partition wall with a filler; adhering the organic EL light emitting element to the color conversion filter at a predetermined position; and setting the outer sealing wall.

In the third aspect of the invention, in a case of an active matrix drive, a thin film transistor may be formed on the substrate, and the first electrode is connected to the thin film transistor, so that the thin film transistor drives the organic EL display. In a case of a passive matrix drive, the first electrode and the second electrode are individually formed in line patterns. The line patterns of the first electrode and the second electrode may extend perpendicular to each other. The outer sealing wall may be formed of an ultraviolet setting type adhesive. It is preferred that the internal filling portion has a refractive index of 1.2 to 2.5 and a visible light transmittance of 50% or higher relative to light having a wavelength of 400 to 800 nm.

According to the fourth aspect of the invention, a method for manufacturing an organic EL display comprises the steps of preparing an organic EL light emitting element by forming the first electrode, an organic EL layer and the second electrode on a substrate; preparing a color conversion filter by forming a color conversion filter layer on a transparent substrate; forming a partition wall around a periphery edge of the organic EL light emitting element; forming an outer sealing wall at an outer side of the partition wall; filling inside of the partition wall with a filler; adhering the organic EL light emitting element to the color conversion filter at a predetermined position; and setting the outer sealing wall.

In the fourth aspect of the invention, in a case of an active matrix drive, a thin film transistor may be formed on the substrate, and the first electrode is connected to the thin film transistor, so that the thin film transistor drives the organic EL display. In a case of a passive matrix drive, the first electrode and the second electrode are individually formed in line patterns. The line patterns of the first electrode and the second electrode may extend perpendicular to each other. The outer sealing wall may be formed of an ultraviolet setting type adhesive. It is preferred that the internal filling portion has a refractive index of 1.2 to 2.5 and a visible light transmittance of 50% or higher relative to light having a wavelength of 400 to 800 nm.

BRIEF DESCRIPTION OF THE DRAWINGS

FIGS. 1(a) to 1(c) are cross sectional views showing an organic EL display of the invention, wherein

FIGS. 3(a) to 3(c) are cross sectional views showing an organic EL display of the invention, wherein

FIGS. 5(a) to 5(c) are cross sectional views showing an organic EL display of the invention, wherein

DETAILED DESCRIPTION OF PREFERRED EMBODIMENTS

Figure 1A:
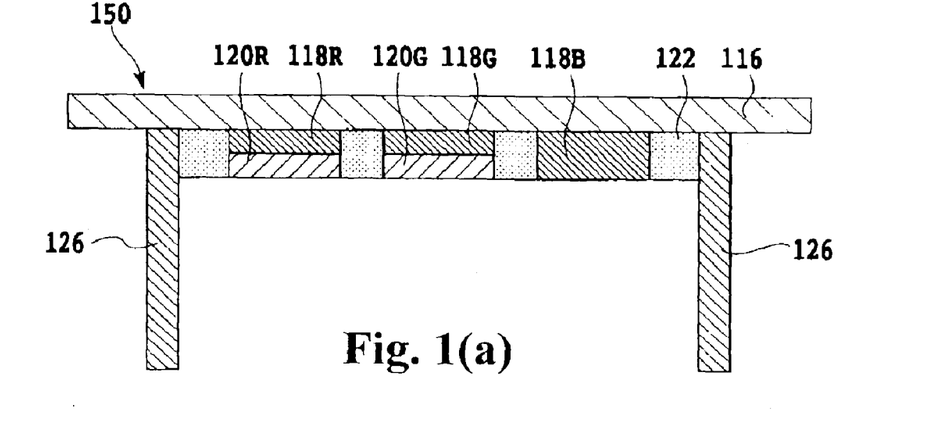
FIG. 1(a) is a cross sectional view showing a color conversion filter.
Figure 1B:
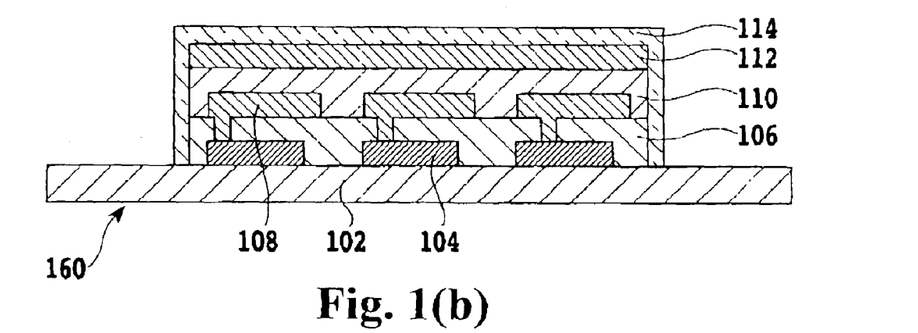
FIG. 1(b) is a cross sectional view showing an organic EL light emitting element.
Figure 1C:
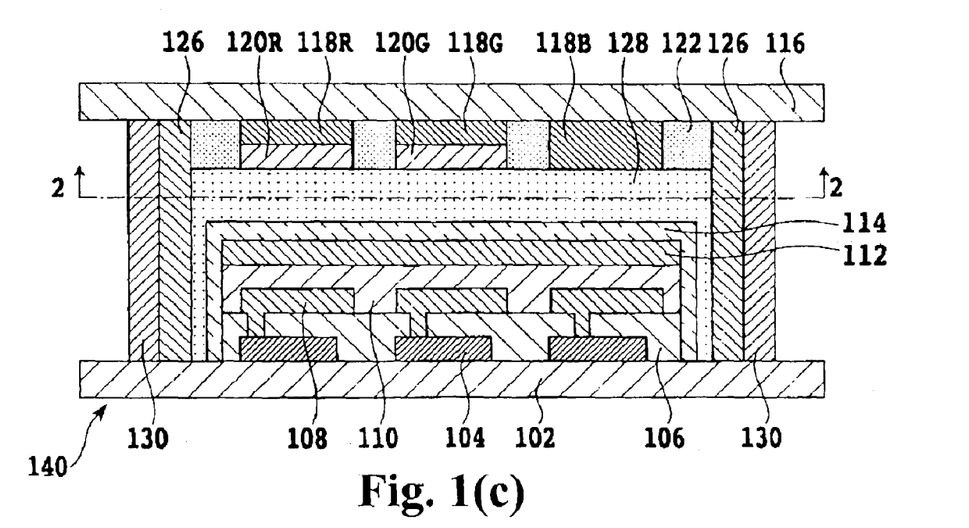
FIG. 1(c) is a cross sectional view showing an organic EL display formed of the color conversion filter and the organic EL light emitting element.
Figure 2:
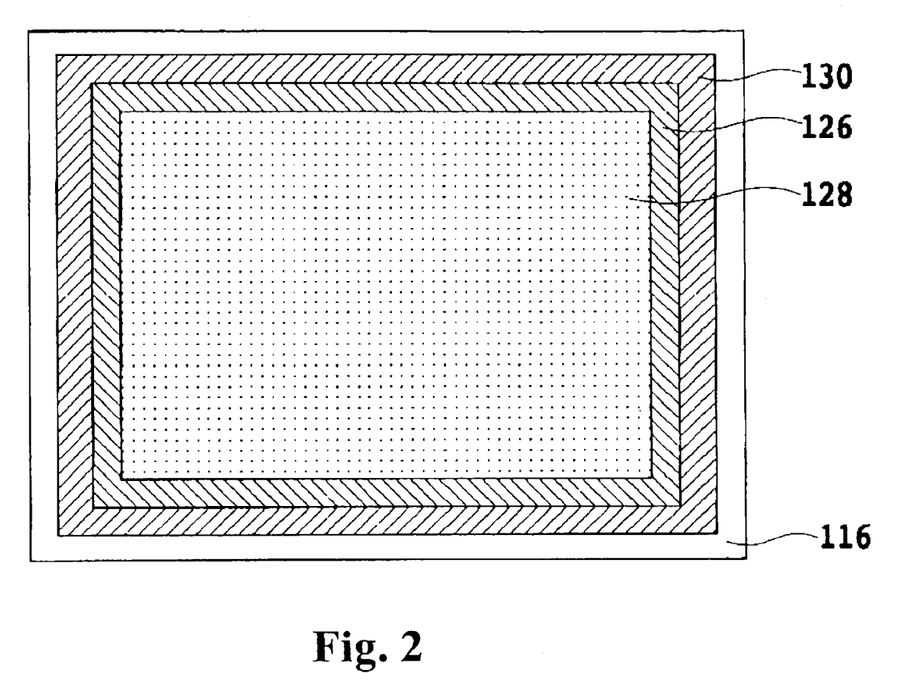
FIG. 2 is a cross sectional view taken along line 2–2' in FIG. 1(c)

Hereunder, embodiments of the present invention will be explained with reference to the accompanying drawings. FIGS. 1(a) to 1(c) are cross sectional views showing an organic EL display produced with the first method of the invention, wherein FIG. 1(a) is a cross sectional view showing a color conversion filter 150, FIG. 1(b) is a cross sectional view showing an organic EL light emitting element 160, and FIG. 1(c) is a cross sectional view showing an organic EL display 140 formed of the color conversion filter 150 and the organic EL light emitting element 160. FIG. 2 is a cross sectional view taken along line 2–2' in FIG. 1(c).

Figure 3A:
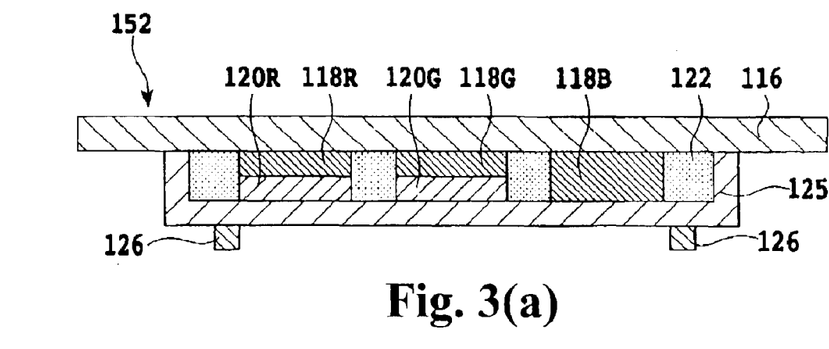
FIG. 3(a) is a cross sectional view showing a color conversion filter.
Figure 3B:
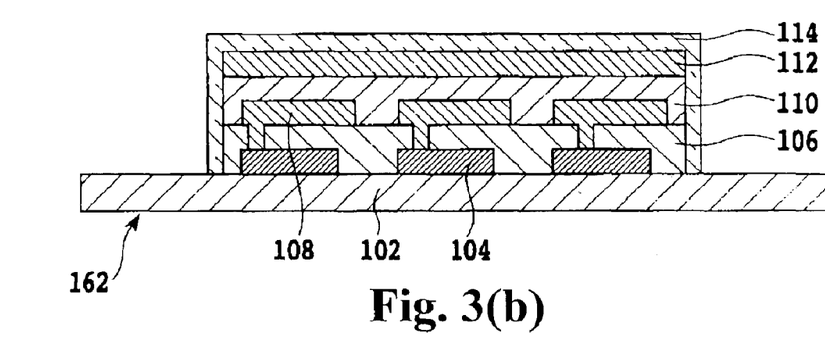
FIG. 3(b) is a cross sectional view showing an organic EL light emitting element.
Figure 3C:
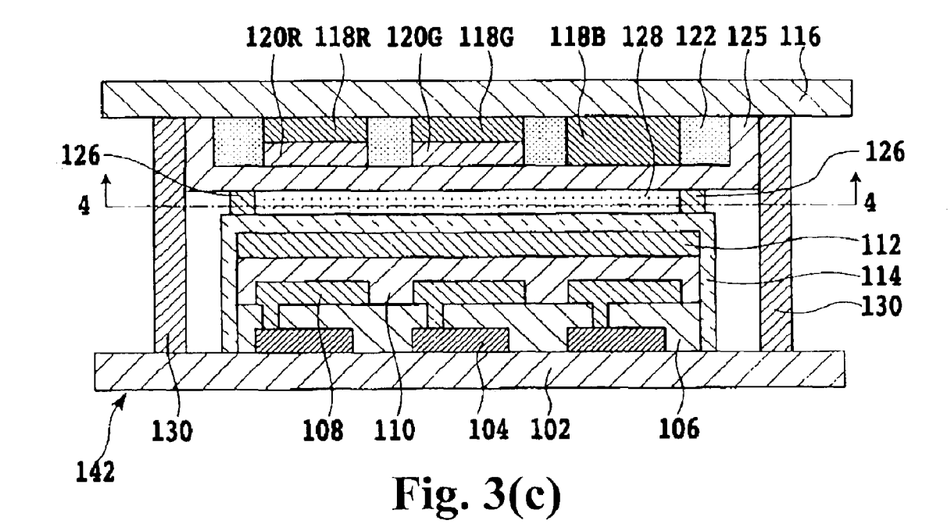
FIG. 3(c) is a cross sectional view showing an organic EL display formed of the color conversion filter and the organic EL light emitting element.
Figure 4:
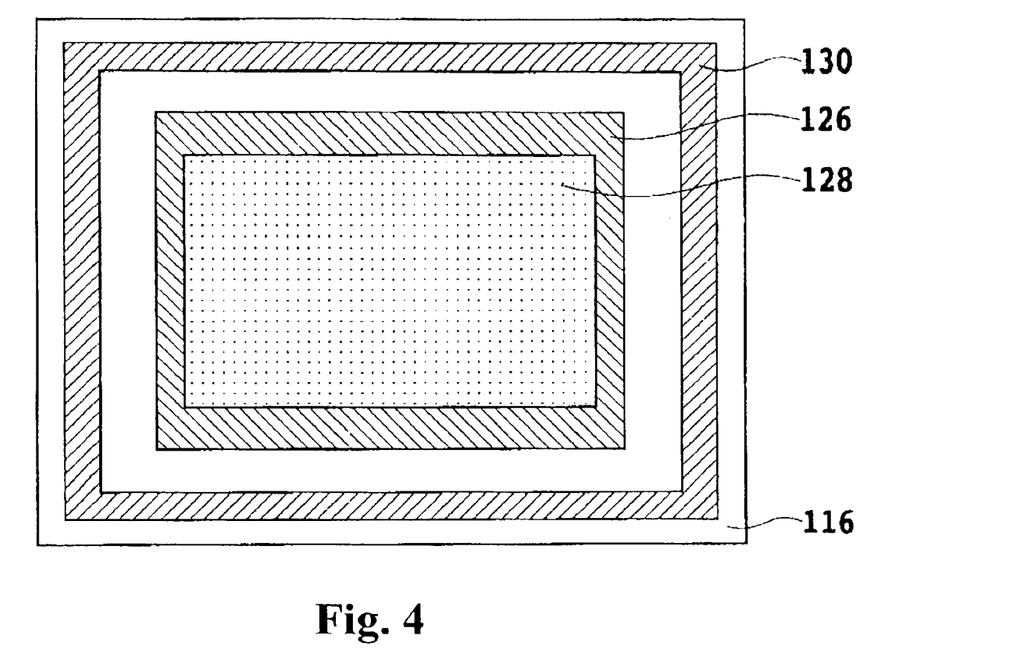
FIG. 4 is a cross sectional view taken along line 4–4' in FIG. 3(c)
Figure 5A:
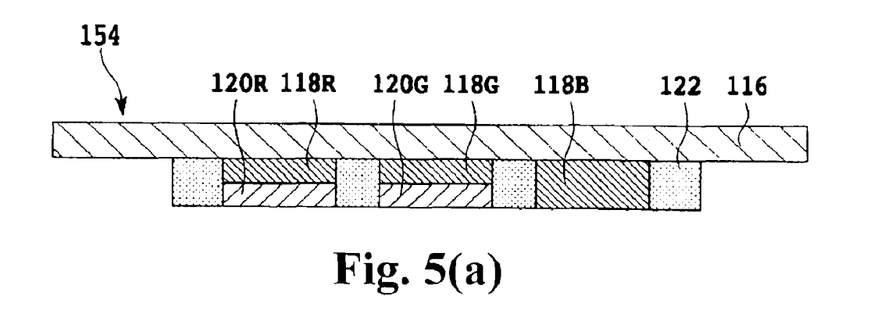
FIG. 5(a) is a cross sectional view showing a color conversion filter.
Figure 5B:
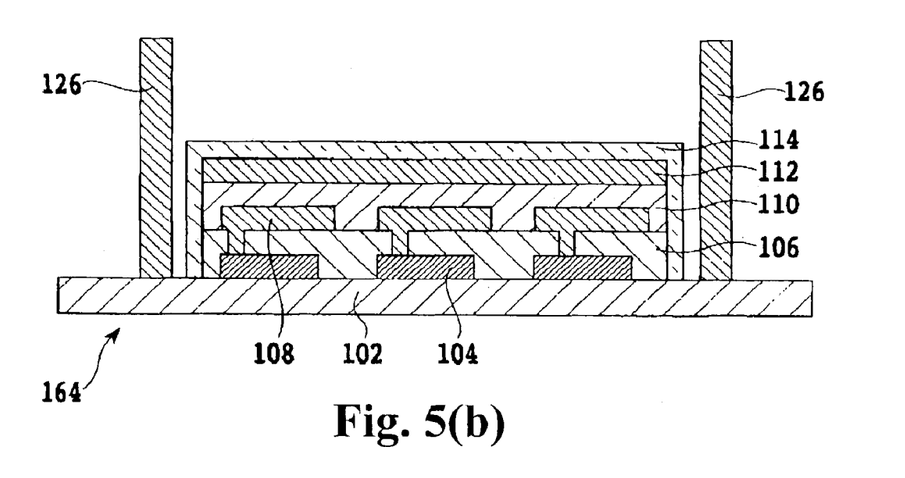
FIG. 5(b) is a cross sectional view showing an organic EL light emitting element.
Figure 5C:
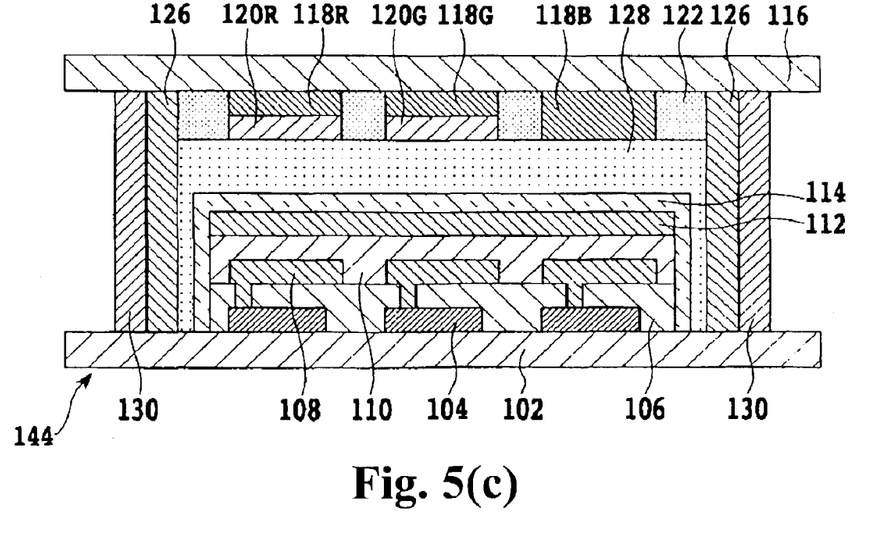
FIG. 5(c) is a cross sectional view showing an organic EL display formed of the color conversion filter and the organic EL light emitting element.

FIGS. 3(a) to 3(c) are cross sectional views showing an organic EL display produced with the second method of the invention, wherein FIG. 3(a) is a cross sectional view showing a color conversion filter 152, FIG. 3(b) is a cross sectional view showing an organic EL light emitting element 162, and FIG. 3(c) is a cross sectional view showing an organic EL display 142 formed of the color conversion filter 152 and the organic EL light emitting element 162. FIG. 4 is a cross sectional view taken along line 4–4' in FIG. 3(c). FIGS. 5(a) to 5(c) are cross sectional views showing an organic EL display produced with the third method of the invention, wherein FIG. 5(a) is a cross sectional view showing a color conversion filter 154, FIG. 5(b) is a cross sectional view showing an organic EL light emitting element 164, and FIG. 5(c) is a cross sectional view showing an organic EL display 144 formed of the color conversion filter 154 and the organic EL light emitting element 164.

The first substrate 102 is an insulating substrate made of glass and plastic, or a substrate having an insulating thin film formed on a semi-conductive or conductive substrate.

TFTs 104 are provided in a case of performing an active matrix drive. The TFTs 104 are arranged in a matrix pattern on the first substrate 102, and their source electrodes or drain electrodes are connected with the first electrodes 108 corresponding to an individual pixel. Preferably, the TFTs 104 are a bottom gate type, in which the gate electrode is disposed below a gate insulating film, and have a polycrystalline silicon film as an active layer.

A wiring portion for the drain electrodes and the gate electrodes of the TFTs 104 and a structure of the TFT itself can be made with a known method in the art as to achieve a desired voltage resistance, and desired OFF-current and ON-current characteristics. In the organic EL display of the invention using a top emission method, the light does not pass through the TFT portion. Therefore, the TFT need not be small for increasing an opening, and the TFT can be designed freely to achieve the aforementioned characteristics advantageously.

In the case of the active matrix drive, the flattening insulating film 106 is preferably formed on the TFTs 104. The flattening insulating film 106 is provided at a portion other than those for connecting the source electrode or the drain electrode of the TFTs 104 to the first electrode 108 and for connecting remaining circuits. The flattening insulating film 106 flattens a substrate surface to facilitate highly fine pattern formation of the subsequent layers. The flattening insulating film 106 is made of an arbitrary material, as known in the art. Preferably, the flattening insulating film 106 is made of an inorganic oxide or nitride, or a polyimide or acrylic resin.

The first electrode 108 may be either of an anode or a cathode. When the first electrode 108 is used as an anode, a material having a high work function is used to make injection of holes efficient. Especially in the ordinary organic EL element, the anode is required to be transparent for transmitting light therethrough, and is made of a conductive metallic oxide such as ITO. The anode does not need to be transparent in the top emission method of the invention. The first electrode 108 can be made of a conductive metallic oxide such as ITO or IZO. When the conductive metallic oxide such as ITO is used, it is preferable to use a metal electrode (Al, Ag, Mo or W) having a high reflectivity as a layer under the first electrode. The metal electrode has a lower reflectivity than that of the conductive metallic oxide so that the metal electrode can be an auxiliary electrode and reflect the light emitted from an organic EL layer 110 to the color conversion filter 150, thereby improving efficiency of the light.

When the first electrode 108 is used as a cathode, the first electrode 108 is made of a material with a low work function, such as an alkaline metal, i.e. lithium or sodium, an alkaline earth metal, i.e. potassium, calcium, magnesium or strontium, an electron-injecting metal of their fluorides, or an alloy or compound of other metals. As described above, a metallic electrode (Al, Ag, Mo or W) having a high reflectivity may be used as an underlying layer. In this case, the light emission of the organic EL layer 110 can be effectively utilized due to lower resistance and reflection.

When the active matrix drive is conducted in the organic EL display of the invention, the first electrodes 108 are separately formed on the flattening insulating film 106 at locations corresponding to the TFTs 104, and are connected to the source electrodes or drain electrodes of the TFTs 104. The first electrodes 108 function as anodes, when connected to the source electrodes, and as cathodes when connected to the drain electrodes. The TFTs 104 and the first electrodes 108 are connected through conductive plugs, which fill contact holes formed in the flattening insulating film. The conductive plugs may be either formed integrally with the first electrodes 108 or made of a metal with a low resistance, such as gold, silver, copper, aluminum, molybdenum or tungsten.

When a passive matrix drive is conducted in the organic EL display of the invention, the first electrodes 108 are formed in a line pattern on the substrate 102 without the TFTs 104 and the flattening insulating film 106. In this case, the first electrodes can be utilized as either anodes or cathodes.

In the organic EL display of the color conversion method of the invention, a visible light having a desired color is emitted by introducing light in a range from near ultraviolet to visible light, or preferably, in a range from a blue color to a bluish green color, into the color conversion filter layer.

The organic EL layer 110 has a structure including at least an organic EL light emitting layer and interposing a hole-injecting layer, a hole-transfer layer and/or an electron-injecting layer, if necessary. Specifically, the following layer constructions are adopted:

Organic EL Light Emitting Layer;

Hole-Injecting Layer/Organic EL Light Emitting Layer;

Organic EL Light Emitting Layer/Electron-Injecting Layer;

Hole-Injecting Layer/Organic EL Light Emitting Layer/Electron-Injecting Layer; and Hole-Injecting Layer/Hole-Transfer Layer/Organic EL Light Emitting Layer/Electron-Injecting Layer.

In these layer constructions, the anodes are connected to the organic EL light emitting layer or the hole-injecting layer, and the cathodes are connected to the organic EL light emitting layer or the electron-injecting layer.

Well-known materials are used for the aforementioned individual layers. For the light emission from the blue color to the bluish green color, the organic EL light emitting layer is preferably formed of a fluorescent brightener of benzothiazole, benzoimidazole or benzooxazole; a metal-chelated oxonium compound; a styryl-benzene compound; or aromatic dimethylidyne compound.

The second electrode 112 is required to inject electrons or holes efficiently into the organic EL layer 110, and to be transparent in a wavelength range of the light emitted from the organic EL layer 110. The second electrode 112 preferably has a transparency of 50% or more relative to light having a wavelength of 400 to 800 nm.

When the second electrode 112 is used as the cathode, the second electrode 112 is made of a material having a low work function for injecting electrons efficiently. It is also necessary that the second electrode 112 is transparent in the wavelength range of the light emitted from the organic EL layer. In order to obtain these two characteristics, it is preferable in the invention that the cathode 112 has a laminated structure composed of a plurality of layers. This is because the material having a low work function generally has a low transparency.

At a portion contacting the organic EL layer 110, an extremely thin film (of 10 nm) is used and made of: an alkaline metal such as lithium or sodium; alkaline earth metal such as potassium, calcium, magnesium or strontium; or an electron-injecting metal of those fluorides, an alloy or compound of another metal. It is possible to inject electrons efficiently when the material having the low work function is used. It is possible to minimize the decrease in the transparency of the material when the extremely thin film is formed. A transparent conductive film made of ITO or IZO is formed on the extremely thin film. The conductive film functions as an auxiliary electrode to lower the resistance of the cathode 112 as a whole, thereby feeding a sufficient current to the organic EL layer 110.

When the second electrode 112 is used as the anode, it is necessary to use a material having a high work function for enhancing the hole injection efficiency. It is also necessary to use a highly transparent material for the light emitted from the organic EL layer 110 to pass through the second electrode. In this case, therefore, it is preferable to use the transparent conductive material such as ITO or IZO.

In the case of the active matrix drive in the organic EL display of the invention, the second electrode 112 can be formed as a uniform electrode, not a patterned electrode. In the case of the passive matrix drive in the organic EL display of the invention, on the other hand, the second electrode 112 is formed in a line pattern intersecting the line pattern of the first electrodes 108 at a right angle.

A passivation layer 114 is formed on the second electrode 112 and covers the layers below the second electrode 112. The passivation layer 114 prevents oxygen, a low molecular component and moisture from penetrating from outside thereby to prevent the organic EL layer 110 from being functionally degraded. The passivation layer 114 is preferred to be transparent in the wavelength range of the light emitted from the organic EL layer 110 for transmitting into the color conversion filter layer.

In order to satisfy these requirements, the passivation layer 114 is made of a material having a high transparency in the visible light range (a transparency of 50% or higher within the range of 400 to 800 nm), an electric insulation, a barrier against moisture and oxygen and low-molecule components, and preferably, a film hardness of 2 H or higher. A material to be used is an inorganic oxide or nitride such as SiOx, SiNx, SiNxOy, AlOx, TiOx, TaOx or ZnOx. A method for forming the passivation layer should not be limited to a special one, but can be a customary method such as a sputtering method, a CVD method, a vacuum evaporation method, a dipping method or a sol-gel method.

Various polymeric materials can be used for the passivation layer, including an imide-modified silicone resin (as disclosed in Japanese Patent Publications (Kokai) No. 05-134112, No. 07-218717, and No. 07-306311); a material containing an inorganic metallic compound (TiO, $Al_2O_3$ or $SiO_2$) dispersed in an acrylic resin, a polyimide resin or a silicone resin (as disclosed in Japanese Patent Publications (Kokai) No. 05-119306 and No. 07-104114); a resin having a reactive vinyl group of acrylate monomer, oligomer, or polymer; a resist resin (as disclosed in Japanese Patent Publications (Kokai) No. 06-300910, No. 07-128519, No. 08-279394, and No. 09-330793); a fluorine resin (as disclosed in Japanese Patent Publications (Kokai) No. 09-330793 and No. 05-36475), or a photo-setting resin and/or a thermosetting resin such as an epoxy resin having a mesogen structure for a high thermal conductivity.

A method for forming the polymer materials should not be limited to a special one. Those resins can be formed with the customary method such as a dry method (e.g., a sputtering method, an evaporation method or a CVD method) or a wet method (e.g., a spin coating method, a roll coating method or a casting method).

The passivation layer 114 may be formed of a single layer or a laminated layer composed of a plurality of layers. It is preferable that the passivation layer 114 has a thickness (or a total thickness in the case of laminated layer) of 0.1 to 10 microns.

It is necessary that the transparent substrate 116 is transparent to the light converted by the color conversion filter layer. Moreover, the transparent substrate 116 needs to withstand conditions (on the solvent, the temperature and so on) used for forming the color conversion filter layer, the black mask and the partition wall, and is preferred to be excellent in the dimensional stability. The transparent substrate 116 is preferred to have a transparency of 50% or higher relative to the light having a wavelength of 400 to 800 nm.

A preferred material for the transparent substrate 116 includes glass, polyethylene terephthalate or polymethyl methacrylate. The especially preferable one is boro-silicate glass or blue sheet glass.

The color conversion filter layer includes a color filter layer 118, a fluorescent conversion layer 120, and a laminate of the color filter layer 118 and the fluorescent conversion layer 120. The fluorescent conversion layer 120 absorbs the light emitted from the organic EL layer 110 in the near ultraviolet region and in the visible light range, especially in the blue to bluish green color range, and emits visible light with a different wavelength as fluorescent light. For a full-color display, separate color conversion filter layers are provided for emitting light of at least a blue color (B) range, a green color (G) range and a red color (R) range. Each of the R, G and B fluorescent conversion layers contains at least an organic fluorescent dye and a matrix resin.

In the invention, preferably one or more fluorescent dyes emitting fluorescent light in at least the red range may be used, or combined with one or more fluorescent dyes emitting fluorescent light in the green range. This is because, when the organic EL layer 110 emitting light in the blue range to a bluish green color, which contains little light in the red color range, is used as the light source, the light in the red range obtained by passing the light from the organic EL layer 110 through a simple red filter becomes dark.

Accordingly, it is possible to output light in the red color range with sufficient intensity when the light in the blue to bluish green color range from the organic EL layer 110 is converted into the light in the red color range with the fluorescent dye. A fluorescent dye for absorbing the light in the blue color to the bluish green color range emitted from the luminous body to emit the fluorescent light in the red color range includes a Rhodamine dye such as Rhodamine B, Rhodamine 6G, Rhodamine 3B, Rhodamine 101, Rhodamine 110, Sulfo-Rhodamine, Basic violet 11 or Basic Red 2; a cyanine dye; a pyridine dye such as 1-ethyl-2-[4-(p-dimethylaminophenyl)-1,3-butadienyl]-pyridinium perchlorate (Pyridin 1); or an oxazine dye. Moreover, various dyes (e.g., direct dye, acid dye, basic dye or dispersion dye) can be used, as far as the fluorescence is obtained.

A fluorescent dye for absorbing the light in the blue color to the bluish green color range emitted from the luminous body to emit the fluorescent light in the green color range includes a coumarin type pigment such as 3-(2'-benzothiazolyl)-7- diethylamino coumarin (Coumarin 6), 3-(2'-benzoimidazolyl)-7-diethylamino coumarin (Coumarin 7), 3-(2'-N-methylbenzoimidazolyl)-7-diethylamino coumarin (Coumarin 30), or 2, 3, 5, 6-1H, 4H-tetrahydro-8-trifluoromethyl quinolizine (9, 9a, 1-gh) coumarin (Coumarin 153); a coumarin type dye such as Basic Yellow 51; or a naphthalimide type dye such as Solvent Yellow 116. Moreover, various dyes (e.g., direct dye, acid dye, basic dye or dispersion dye) can be used, as far as the fluorescence is obtained.

To obtain the light in the blue color range, the light emitted from the organic EL layer 110 can be outputted through a blue color filter.

The organic fluorescent dye used in the invention may be blended in advance into polymethacrylic ester, polyvinyl chloride, a copolymer resin of vinyl chloride-vinyl acetate, an alkyd resin, an aromatic sulfonamide resin, an urea resin, a melamine resin or a benzoquanamine resin or their resin mixture to be changed into pigment as an organic fluorescent pigment. Moreover, these organic fluorescent dyes or organic fluorescent pigments, which are generally termed as the organic fluorescent dye in the specification, may be used either solely or in combination of two or more kinds for adjusting a hue of the fluorescence.

The fluorescent conversion layer 120 of the invention contains 0.01 to 5 wt %, or preferably 0.1 to 2 wt % of the organic fluorescent dye with reference to the weight of the fluorescent conversion layer. By using the organic fluorescent dye in the containing range, a sufficient wavelength conversion can be obtained without a decrease in the color conversion effect such as the density quenching due to the curing.

The matrix resin used in the fluorescent conversion layer of the invention becomes insoluble and infusible after the photo-setting or photo-/thermo-setting resin (or resist) is cured through a photo- and/or heat-treatment to produce radial species or ion species for polymerization or crosslinking. In order to pattern the fluorescent conversion layer, it is desired that the photo-setting or photo-/thermo-setting resin is soluble, when unexposed, in an organic solvent or alkaline solution.

Specifically, the matrix resin includes: a composite film containing an acrylic polyfunctional monomer, an oligomer having a plurality of acroyl and metacoyl groups, and a photo-or heat-polymerization initiator, and treated through a photo- or heat-treatment to produce photo radicals or heat radicals for polymerization; a composite containing polyvinyl cinnamate ester and a sensitizer, and treated through a photo- or heat-treatment to dimerize and crosslink the composite; a composite film containing linear or cyclic olefin and bisazide, and treated through a photo- or heat-treatment to produce nitrene for crosslinking with olefin; and a composite film containing monomer having epoxy groups and an acid generator, and treated through a photo- or heat-treatment to produce acid (cation) for polymerization. It is especially preferred that the composite film containing acrylic polyfunctional monomer, oligomer and photo- or heat-polymerization initiator is polymerized. It is possible to make a fine pattern of the composite, and the polymerized composite has a high reliability such as a solvent resistance, a heat resistance and so on.

It is preferred that the photo-polymerization initiator, the sensitizer and the acid generator used in the invention starts the polymerization with the light of the wavelength, which is not absorbed by the fluorescent conversion dye. In the fluorescent conversion layer of the invention, it is possible to eliminate the photo-polymerization initiator or the heat-polymerization initiator, when the photo-setting or photo/thermo-setting resin itself can be polymerized with the light or heat.

The matrix resin (fluorescent conversion layer) is formed by applying a solution or dispersion containing the photo-setting or photo-/thermo-setting resin, the organic fluorescent dye and an additive, to a support substrate to form a resin layer, and then by exposing a desired portion of the photo-setting or photo-/thermo-setting resin to polymerize the portion. The desired portion is exposed to make the photo-setting or photo/thermo-setting resin insoluble, and is then patterned. The patterning can be executed with a customary method in which the resin of the unexposed portion is removed or dispersed with the organic solvent or alkaline solution.

The red color may be obtained exclusively from a fluorescent conversion layer 120R. In a case that the color does not have sufficient purity through the conversion with the fluorescent dye, the fluorescent conversion layer 120R and a color filter layer 118R may be laminated, as shown in FIG. 1(a). When the color filter layer 118R is used together, a thickness is preferred to be from 1 to 1.5 microns.

The green color may be obtained exclusively from a fluorescent conversion layer 120G. In case the color does not have sufficient purity through the conversion with the fluorescent dye, the fluorescent conversion layer 120G and a color filter layer 118G may be laminated, as shown in FIG. 1(a). When the color filter layer 118G is used together, a thickness is preferred to be from 1 to 1.5 microns. Alternatively, in the case that the luminescence of the organic EL layer 110 contains the sufficient light in the green color range, only the color filter layer 118G is sufficient. When the color filter layer 118G is used, a thickness is preferred to be 0.5 to 10 microns.

To obtain the blue color, on the other hand, it is sufficient to use only a color filter layer 118B, as shown in FIG. 1(a). When the color filter layer 118B is exclusively used, a thickness is preferred to be 0.5 to 10 microns. The color conversion filter layer may be formed in a stripe pattern separated for the individual color, as well known, or may be formed in a structure separated for individual sub-pixels.

It is preferred that a black mask 122 is formed in the region between the color conversion filter layers corresponding to the individual colors. With the black mask, the light can be prevented from leaking to the color conversion filter layers of the adjacent sub-pixels, so that desired fluorescent conversion color can be exclusively obtained without any bleeding. As far as sealing of the later-described organic EL display may not be obstructed, the black mask may be disposed around the region, in which the color conversion filter layer is formed on the transparent substrate 116. The black mask 122 is preferred to have a thickness of 0.5 to 2.0 microns.

The flattening layer 125 covers the color conversion filter layer, and is formed of a material having a proper elasticity without damaging the function of the color conversion filter layer. The preferable material is a polymer having a surface hardness of the pencil hardness 2H and a Young's modulus of 0.3 MPa or higher, and is capable of forming a smooth coating surface on the color conversion filter layer without degrading the function of the fluorescent conversion layer 120. More preferably, the material is a polymer having a high transparency in the visible range (a transparency of 50% or more in the range of 400 to 800 nm), an electric insulation and barrier properties against the moisture, oxygen and low-molecular components.

The polymer material includes a photo-setting resin and/or a thermosetting resin such as an imide-modified silicone resin (as disclosed in Japanese Patent Publications (Kokai) No. 05-134112, No. 07-218717, and No. 07-306311); a material containing an inorganic metallic compound (TiO, $Al_2O_3$ or $SiO_2$) dispersed in an acrylic resin, a polyimide resin or a silicone resin (as disclosed in Japanese Patent Publications (Kokai) No. 05-119306 and No. 07-104114); a resin having a reactive vinyl group of acrylate monomer, oligomer, or polymer; a resist resin (as disclosed in Japanese Patent Publications (Kokai) No. 06-300910, No. 07-128519, No. 08-279394, and No. 09-330793); a fluorine resin (as disclosed in Japanese Patent Publications (Kokai) No. 09-330793 and No. 05-36475), or an epoxy resin having a mesogen structure for a high thermal conductivity. A method for forming the flattening layer 125 with those polymer materials should not be limited to a special one. The resins can be formed by a customary method such as the dry method (e.g., sputtering method, evaporation method or CVD method) or the wet method (e.g., spin coating method, roll coating method or casting method).

The flattening layer 125 has a thickness of about 1 to 10 microns. The flattening layer 125 is preferred to have a thickness of about 3 to 5 microns, when formed by the casting method or the spin coating method.

The internal filling portion 128 is formed to fill an internal space 620 formed in the conventional display (FIG. 6), so that the light emitted from the organic EL layer 110 does not reflect at the internal space interface in a large extent and is efficiently transmitted to the color conversion filter. The internal filling portion 128 is provided at least in the region (the display region), where the organic EL layer 110 emits the light and the emitted light propagates to the color conversion filter. The internal filling portion 128 has a visible light transmittance of 20% to 95%, preferably, 60% to 95% relative to the light with a wavelength of 400 to 800 nm, and a refractive index of 1.2 to 2.5. With the characteristics, the refractive index difference at the interfaces of the transmission paths of the emitted light from the organic EL layer 110 can be reduced to suppress the reflections at the interfaces thereby to transmit the light efficiently to the color conversion filter layer.

A filler filled in the internal filling portion 128 is an inactive liquid with no influence on the characteristics of the organic EL light emitting element and the color conversion filter. Alternatively, the filler may also be a liquid to be gelled after sealing the outer periphery. The inactive liquid used as the filler has a visible light transmittance of 20% to 95%, preferably 60% to 95% relative to the light with a wavelength of 400 to 800 nm, and a refractive index of 1.2 to 2.5. When a liquid to be gelled after sealing the outer periphery is used as the filler, it should have the above-specified visible light transmittance and refractive index. An example of the filler includes a silicone resin, a fluorine containing inactive liquid or fluorine containing oil.

Before the organic EL light emitting element is fixed to the color conversion filter, a filler in a quantity equal to a volume of an internal space formed by the partition wall 126 is poured into the space so that the internal filling portion 128 is formed when the organic EL light emitting element and the color conversion filter are fixed.

The outer sealing wall 130 is disposed on the outer periphery of the partition wall, and has a function to fix the organic EL light emitting element and the color conversion filter for protecting the internal components against oxygen or moisture from the external environment. The outer sealing wall 130 is made of an ultraviolet setting type adhesive.

The ultraviolet setting type adhesive does not exhibit viscosity change or gelation before setting, so that the color conversion filter layer and the light emitting portion of the organic EL light emitting element can be aligned precisely.

Once the alignment is completed, the ultraviolet ray is irradiated to set the ultraviolet setting type adhesive. For example, the adhesive is preferred to be set in 10 to 60 seconds when exposed to the ultraviolet ray of 100 $mW/cm^2$. The ultraviolet setting type adhesive can be sufficiently set within this time range to obtain proper adhesion without adversely affecting the other components by the ultraviolet ray irradiation. From the viewpoint of the efficiency of the production process, the time range is preferred.

The ultraviolet setting type adhesive may contain glass beads or silica beads having a diameter of 5 to 50 microns, preferably a diameter of 5 to 20 microns. The beads regulate an inter-base distance (or a distance between the substrate 102 and the transparent substrate 116) when the organic EL light emitting element is fixed to the color conversion filter, and bears a pressure to be applied for the adhesion. Moreover, a stress generated during the display driving time (especially, a stress at the outer periphery of the display) is also borne to prevent the display from being deteriorated by the stress.

In the first manufacture method of the invention, the partition wall 126 is mounted on the color conversion filter 150, as shown in FIG. 1(a). The partition wall 126 is disposed at the peripheral edge of the transparent substrate 116 to completely enclose an area where the color conversion filter layer and the black mask 122 are disposed. As shown in FIG. 2, the outer sealing wall 130 is formed on the outer side of the partition wall 126, and the internal filling portion 128 is formed on the inner side thereof.

Alternatively, in the second manufacture method of the invention, as shown in FIG. 3(a), the color conversion filter 152 is provided with the partition wall 126. The partition wall 126 is disposed at the outside of the display region of the flattening layer 125 covering the color conversion filter layer and the black mask 122, so that the partition wall 126 completely encloses the display region. As shown in FIG. 4, the internal filling portion 128 is formed on the inner side of the partition wall 126. The outer sealing wall 130 may be formed on the outer side of the partition wall 126, and a space may be formed between the partition wall 126 and the outer sealing wall 130.

Alternatively, in the third manufacture method of the invention, as shown in FIG. 5(b), the partition wall 126 may be disposed on the organic EL light emitting element 164. The partition wall 126 is disposed on the peripheral edge portion of the organic EL light emitting element, namely, the peripheral edge portion of the components below the passivation layer 114 disposed over the substrate 102, so that the partition wall 126 completely encloses the components. In this case, on the outer side of the partition wall 126, as shown in FIG. 2, the outer sealing wall 130 is also formed on the inner side in which the internal filling portion 128 is formed.

The partition wall 126 can be made of an arbitrary material having no deformation for a period of time from the adhesion of the organic EL light emitting element 160 and the color conversion filter 150 to the setting of the outer sealing wall 130. The material preferably includes a photo-sensitive photoresist based on an acrylic resin or a novolak resin. For example, the partition wall 126 can be formed at a predetermined position by applying the photoresist to the transparent substrate 116 or the substrate 102 by the spin coating, dip coating or roll coating method, and then by patterning the photoresist by the photolithography. Alternatively, the partition wall 126 may be formed by forming a partition wall of a desired shape on the film substrate treated with a silicone layer, and by transferring the partition wall to a predetermined position.

In the first and third manufacture methods, the partition wall 126 is preferred to have a height corresponding to a distance between the substrate 102 and the transparent substrate 116. It is especially preferred that the partition wall 126 has a height of 5 to 50 microns. In the second manufacture method, it is preferred that the partition wall 126 has a height corresponding to a distance between the passivation layer 114 and the flattening layer 125. It is especially preferred that the partition wall 126 has a height of 1 to 10 microns.

The partition wall 126 having the height in the aforementioned range can separate the filling material of the internal filling portion 128 from the material of the outer sealing wall 130 sufficiently, and can be manufactured in a single application step. Moreover, the height in the aforementioned range is preferred because the distance between the color conversion filter layer and the organic EL layer 110 is properly kept, thereby causing no negative influence on the characteristics of the visible angle.

When the partition wall 126 has a width of 10 to 2,000 microns, it is possible to separate the filling material of the internal filling portion 128 from the material of the outer sealing wall 130 sufficiently, so that a space for the outer sealing wall is secured. The width is also preferred from a view of preventing the overlap between the color conversion filter layer and the partition wall 126.

According to the first manufacture method of the invention, as shown in FIGS. 1(*a*)–1(*c*), the organic EL display 140 is formed by adhering the organic EL light emitting element 160 and the color conversion filter 150 having the partition wall 126.

The color conversion filter 150 is obtained by forming, over the transparent substrate 116, the color conversion filter layers corresponding to the individual colors RGB, the black masks 122 positioned between and around them, and the partition wall 126. In the embodiment shown in FIGS. 1(*a*)–1(*c*): the red color conversion filter layer is composed of the red color filter layer 118R and the red color fluorescent conversion layer 120R; the green color conversion filter layer is composed of the green color filter layer 118G and the green color fluorescent conversion layer 120G; and the blue color conversion filter layer is composed of the blue color filter layer 118B. The color conversion filter 150 is obtained by spin coating the photosensitive photoresist based on the acrylic resin or the like, after the individual color conversion filter layers and the black masks 122 were formed, and by subsequently executing the patterning by the photolithography thereby to form the partition wall 126 at the predetermined position. Alternatively, the color conversion filter 150 may be obtained by the partition wall 126 formed in advance to the parting film material, as has been described hereinbefore.

By using the means known in the relevant art, on the other hand, the TFTs 104, the flattening insulating layer 106, the first electrodes 108, the organic EL layer 110, the second electrode 112 and the passivation layer 114 are sequentially laminated over the first substrate 102, thereby to form the organic EL light emitting element 160. Alternatively, in the case of the passive matrix drive, the first electrodes 108 of the line pattern shape, the organic EL layer 110, the second electrode 112 having the line pattern extending perpendicularly of the line pattern of the first electrodes 108, and the passivation layer 114 may be sequentially laminated to form the organic EL light emitting element.

Next, the color conversion filter 150 and the organic EL light emitting element 160 thus formed are arranged in a dry nitrogen atmosphere (desired to have oxygen and moisture concentrations of 1 ppm or less). A dispenser robot is used to apply the ultraviolet setting type adhesive to the outer periphery of the partition wall 126. And, this partition wall 126 has its inside filled with a filler in a volume corresponding to that of the internal space to be formed. The desired amount of the filler can be easily determined by those skilled in the art. After this, the organic EL light emitting element 160 and the color conversion filter 150 are held in close contact with each other, as shown in FIG. 1(*c*).

Subsequently, the light emitting portion of the organic EL light emitting element and the color conversion filter layer are aligned with each other. In the case of the active matrix drive, the first electrodes 108 and the color conversion filter layer are positioned to each other. In the case of the passive matrix, on the other hand, the intersections between the line patterns of the first electrodes and the second electrode are positioned to the color conversion filter layer. After this, the aforementioned ultraviolet setting type adhesive is irradiated with the ultraviolet ray so that it is set to form the outer sealing wall 130. It is preferred that the ultraviolet ray irradiation is done in the luminance of 100 mW/cm$^2$ for 30 seconds.

By using the partition wall 126, the internal filling portion 128 and the outer sealing wall 130 to fix the substrate 102 and the transparent substrate 116 at a spacing of 1 to 100 microns, preferably 5 to 50 microns, as has been described hereinbefore, it is possible to construct the organic EL display 140 which is kept away from the moisture of the external environment and which is reliable for a long time.

According to the second manufacture method of the invention, as shown in FIGS. 3(*a*)–3(*c*), the organic EL display 142 is formed by adhering the organic EL light emitting element 162 and the color conversion filter 152 having the partition wall 126 over the portion other than the display region of the flattening layer 125.

In this manufacture method, the color conversion filter 152 is obtained by forming, over the transparent substrate 116, the color conversion filter layers corresponding to the individual colors RGB, the black masks 122 positioned between and around them, the flattening layer 125 for covering the aforementioned layer, and the partition wall 126 over the portion other than the display region of the flattening layer. In the embodiment shown in FIGS. 1(*a*)–1(*c*), the red color conversion filter layer is composed of the red color filter layer 118R and the red color fluorescent conversion layer 120R; the green color conversion filter layer is composed of the green color filter layer 118G and the green color fluorescent conversion layer 120G; and the blue color conversion filter layer is composed of the blue color filter layer 118B.

After the individual color conversion filter layers and the black mask 122 were formed, the flattening layer 125 is formed by coating the polymer material by the customary method such as the dry method (e.g. sputtering method, evaporation method or CVD method) or the wet method (e.g. spin coating method, roll coating method or casting method). After this, the color conversion filter 152 is obtained by spin coating the photosensitive photoresist based on the acrylic resin or the like, and by subsequently executing the patterning by the photolithography thereby to form the partition wall 126 over the portion other than the display region of the flattening layer. Alternatively, the color conversion filter 152 may be obtained by the partition wall 126 formed in advance to the parting film material, as has been described hereinbefore.

On the other hand, the organic EL light emitting element 162 has a structure identical to that of the organic EL light emitting element 160 shown in FIG. 1(b), therefore, it is formed by the same method as the first manufacture method.

Next, the color conversion filter 152 and the organic EL light emitting element 162 thus formed are arranged in a dry nitrogen atmosphere (desired to have oxygen and moisture concentrations of 1 ppm or less). And, a dispenser robot is used to apply the ultraviolet setting type adhesive to the outer periphery of the flattening layer 125. And, this partition wall 126 has its inside filled with a filler in a volume corresponding to that of the internal space to be formed by the partition wall 126. The desired amount of the filler can be easily determined by those skilled in the art. After this, the organic EL light emitting element 162 and the color conversion filter 152 are held in close contact with each other, as shown in FIG. 3(c). By thus forming the partition wall 125 over the portion other than the display region of the flattening layer, it is possible to reduce the quantity of the filler to fill the internal filling portion. Moreover, the area to be filled is reduced to facilitate the homogeneous filling of the filler.

Subsequently, the light emitting portion of the organic EL light emitting element and the color conversion filter layer are aligned with each other. In the case of the active matrix drive, the first electrodes 108 and the color conversion filter layer are positioned to each other. In the case of the passive matrix, on the other hand, the intersections between the line patterns of the first electrodes and the second electrode are positioned to the color conversion filter layer. After this, the aforementioned ultraviolet setting type adhesive is irradiated with the ultraviolet ray so that it is set to form the outer sealing wall 130. It is preferred that the ultraviolet ray irradiation is done in the luminance of 100 mW/cm$^2$ for 30 seconds.

By using the partition wall 126, the internal filling portion 128 and the outer sealing wall 130 to fix the substrate 102 and the transparent substrate 116 at a spacing of 1 to 100 microns, preferably 5 to 50 microns, as has been described hereinbefore, it is possible to construct the organic EL display 142 which is kept away from the moisture of the external environment and which is reliable for a long time.

According to the third manufacture method of the invention, as shown in FIGS. 5(a)–5(c), the organic EL display 144 is formed by adhering the organic EL light emitting element 164 having the partition wall 126 and the color conversion filter 154. The organic EL display 144 formed by this method has a structure similar to that of the organic EL display 140 shown in FIG. 1(c) except that the partition wall 126 is fixed on the substrate 102.

The color conversion filter 154 is obtained by forming, over the transparent substrate 116, the color conversion filter layers corresponding to the individual colors RGB and the black masks 122 positioned between and around them. In this manufacture method, too, the individual color conversion filter layers have a construction similar to that of the electrode shown in FIGS. 1(a)–1(c). The color conversion filter 154 is obtained by forming the individual color conversion filter layers and the black masks 122.

By using the means known in the relevant art, on the other hand, the TFTs 104, the flattening insulating layer 106, the first electrodes 108, the organic EL layer 110, the second electrode 112 and the passivation layer 114 are sequentially laminated over the first substrate 102. Alternatively, in the case of the passive matrix drive, the first electrodes 108 of the line pattern shape, the organic EL layer 110, the second electrode 112 having the line pattern extending perpendicularly of the line pattern of the first electrodes 108, and the passivation layer 114 may be sequentially laminated to form the organic EL light emitting element. Subsequently, the photosensitive photoresist based on an acrylic resin or the like is pin coated, and the patterning is then executed by the photolithography so that the partition wall 126 is formed in the peripheral edge of the organic EL light emitting element, namely, in a manner to completely enclose the individual components below the passivation layer 114, thereby to obtain the organic EL light emitting element 164.

Next, the color conversion filter 154 and the organic EL light emitting element 164 thus formed are arranged in a dry nitrogen atmosphere (desired to have oxygen and moisture concentrations of 1 ppm or less). A dispenser robot is used to apply the ultraviolet setting type adhesive to the outer periphery of the partition wall 126 mounted on the organic EL light emitting element 164. And, this partition wall 126 has its inside filled with a filler in a volume corresponding to that of the internal space to be formed. The desired amount of the filler can be easily determined by those skilled in the art. After this, the organic EL light emitting element 164 and the color conversion filter 154 are held in close contact with each other.

Subsequently, the light emitting portion of the organic EL light emitting element and the color conversion filter layer are aligned with each other. In the case of the active matrix drive, the first electrodes 108 and the color conversion filter layer are positioned to each other. In the case of the passive matrix, on the other hand, the intersections between the line patterns of the first electrodes and the second electrode are positioned to the color conversion filter layer. After this, the aforementioned ultraviolet setting type adhesive is irradiated with the ultraviolet ray so that it is set to form the outer sealing wall 130. It is preferred that the ultraviolet ray irradiation is done in the luminance of 100 mW/cm$^2$ for 30 seconds.

By using the partition wall 126, the internal filling portion 128 and the outer sealing wall 130 to fix the substrate 102 and the transparent substrate 116 at an spacing of 1 to 100 microns, preferably 5 to 50 microns, as has been described hereinbefore, it is possible to construct the organic EL display 144 which is kept away from the moisture of the external environment and which has a reliability for a long time.

EXAMPLE 1

The TFTs, the anodes, the organic EL layer, the cathode and the passivation layer were sequentially formed over the glass substrate, to obtain the organic EL light emitting element 160, as shown in FIG. 1(b). The anodes were arranged with a pitch of 195 microns in the longer side direction and a pitch of 65 microns in the shorter side direction. The area, in which each anode and the cathode confront each other, had sizes of 180 microns in the longer side direction and 50 microns in the shorter side direction.

Over the transparent glass substrate, there were laminated: the black masks having a thickness of 1.5 microns; red, green and blue color filter layers having individual thicknesses of 1.5 microns; and red and green fluorescent conversion layers having individual thicknesses of 10 microns. The individual color filter layers and fluorescent conversion layers had a size of 55×185 microns. Next, the photosensitive photoresist (ZPN1100, trademark of Nippon Zeon) based on a novolak resin was spin coated, and the patterning was subsequently executed by the photolithography to form the partition wall 126 with a height of 20 microns and a width of 500 microns at a predetermined position thereby to obtain the color conversion filter 150 shown in FIG. 1(*a*).

Next, the color conversion filter 150 and the organic EL light emitting element 160 thus formed were arranged in the dry nitrogen atmosphere (desirably having the oxygen and moisture contents of 1 ppm or less) in the globe box. A dispenser robot was used to apply the ultraviolet setting type adhesive (30Y-437, trademark of Three Bond), in which beads of a diameter of 20 microns were dispersed, to the outer side of the partition wall 126. And, the inside of the partition wall 126 was filled with a predetermined quantity of transparent silicon resin (TSE3051, trademark of Toshiba Silicon).

After this, the organic EL light emitting element 160 and the color conversion filter 150 were held in close contact with each other, as shown in FIG. 1(*c*). Subsequently, the first electrodes 108 (the light emitting portions of the organic EL light emitting element) and the color conversion filter layer were aligned and then irradiated with the ultraviolet ray in the luminance of 100 mW/cm$^2$ for 30 seconds to set the adhesive so that the outer sealing wall 130 was formed. Moreover, the heat treatment at 80° C. for 60 minutes was made to gel the aforementioned transparent silicone resin to form the internal filling portion 128 so that the organic EL display 140 was obtained.

EXAMPLE 2

The organic EL display was obtained by repeating Example 1 excepting that a fluorine-containing inert liquid, FN FC40 (trademark of Sumitomo Three M) was used as the filler.

EXAMPLE 3

The organic EL display was obtained by repeating Example 1 excepting that fluorine-containing oil, iDN S-65 (trademark of Daikin Kogyo) was used as the filler.

EXAMPLE 4

The TFTs, the anodes, the organic EL layer, the cathode and the passivation layer were sequentially formed over the glass substrate, to obtain the organic EL light emitting element 162, as shown in FIG. 3(*b*). The anodes were arranged with a pitch of 195 microns in the longer side direction and a pitch of 65 microns in the shorter side direction. The area, in which each anode and the cathode confront each other, had sizes of 180 microns in the longer side direction and 50 microns in the shorter side direction.

Over the transparent glass substrate, there were laminated: the black masks having a thickness of 1.5 microns; red, green and blue color filter layers having individual thicknesses of 1.5 microns; and red and green fluorescent conversion layers having individual thicknesses of 10 microns. The individual color filter layers and fluorescent conversion layers had a size of 55×185 microns. Next, the photosensitive photoresist (ZPN1100, trademark of Nippon Zeon) based on a novolak resin was spin coated to a size to be confined in the outer sealing wall by the photolithography thereby to obtain the flattening layer 125 having a thickness of 3 microns. Moreover, the photosensitive photoresist (ZPN1100, trademark of Nippon Zeon) was spin coated, and the patterning was subsequently executed by the photolithography to form the partition wall 126 with a height of 5 microns and a width of 200 microns at a predetermined position (at the portion other than the display region of the flattening layer 125) thereby to obtain the color conversion filter 152 shown in FIG. 3(*a*).

Next, the color conversion filter 152 and the organic EL light emitting element 162 thus formed were arranged in the dry nitrogen atmosphere (desirably having the oxygen and moisture contents of 1 ppm or less) in the globe box. A dispenser robot was used to apply the ultraviolet setting type adhesive (30Y-437, trademark of Three Bond), in which beads of a diameter of 20 microns were dispersed, to the outer side of said flattening layer 125. The inside of the partition wall 126 was filled with a predetermined quantity of transparent silicon resin (TSE3051, trademark of Toshiba Silicon).

After this, the organic EL light emitting element 162 and the color conversion filter 152 were held in close contact with each other, as shown in FIG. 1(*c*). Subsequently, the first electrodes 108 (the light emitting portions of the organic EL light emitting element) and the color conversion filter layer were aligned and then irradiated with the ultraviolet ray in an illuminance of 100 mW/cm$^2$ for 30 seconds to set the adhesive so that the outer sealing wall 130 was formed. Moreover, the heat treatment at 80° C. for 60 minutes was made to gel the aforementioned transparent silicone resin to form the internal filling portion 128 so that the organic EL display 142 was obtained.

EXAMPLE 5

The TFTs, the anodes, the organic EL layer, the cathode and the passivation layer were sequentially formed over the glass substrate. Next, the photosensitive photoresist (ZPN1100, trademark of Nippon Zeon) based on a novolak resin was spin coated, and the patterning was subsequently executed by the photolithography to form the partition wall 126 with a height of 20 microns and a width of 500 microns at a predetermined position thereby to obtain the organic EL light emitting element 164 shown in FIG. 5(*b*). The anodes were arranged with a pitch of 195 microns in the longer side direction and a pitch of 65 microns in the shorter side direction. The area, in which each anode and the cathode confront each other, had sizes of 180 microns in the longer side direction and 50 microns in the shorter side direction.

Over the transparent glass substrate, there were laminated: the black masks having a thickness of 1.5 microns; red, green and blue color filter layers having individual thicknesses of 1.5 microns; and red and green fluorescent conversion layers having individual thicknesses of 10 microns, to obtain the color conversion filter 154, as shown in FIG. 5(*a*). The individual color filter layers and fluorescent conversion layers had a size of 48×178 microns.

Next, the color conversion filter 154 and the organic EL light emitting element 164 thus formed were arranged in the dry nitrogen atmosphere (desirably having the oxygen and moisture contents of 1 ppm or less) in the globe box. A dispenser robot was used to apply the ultraviolet setting type adhesive (30Y-437, trademark of Three Bond), in which beads of a diameter of 20 microns were dispersed, to the outer side of the partition wall 126. And, the inside of the partition wall 126 was filled with a predetermined quantity of transparent silicon resin (TSE3051, trademark of Toshiba Silicon).

After this, the organic EL light emitting element 164 and the color conversion filter 154 were held in close contact with each other, as shown in FIG. 5(*c*). Subsequently, the first electrodes 108 (the light emitting portions of the organic EL light emitting element) and the color conversion filter layer were aligned and then irradiated with the ultraviolet ray in the luminance of 100 mW/cm² for 30 seconds to set the adhesive so that the outer sealing wall 130 was formed. Moreover, the heat treatment at 80° C. for 60 minutes was made to gel the aforementioned transparent silicone resin to form the internal filling portion 128 so that the organic EL display 144 was obtained.

According to the description of the invention thus far made, there is adopted the structure, in which the outer sealing wall and the internal filling portion are separated by forming the partition wall, so that the material used in the internal filling portion can be prevented from contacting with the material, before set, for the outer sealing wall. By using the ultraviolet setting type adhesive for forming the outer sealing wall, it is possible to perform a precise alignment and a fixture for a short time thereby to improve the outer sealing wall structure and the sealing method, which is kept away from the moisture or the like from the external environment. Moreover, the flattening layer is mounted on the color conversion filter, and the partition wall is arranged at the portion other than the display region, so that the structure fills the internal filler only into the portion, in which the light from the light emitting element passes. Thus, it is possible to reduce the quantity of the filler to be used, and to distribute the filler more homogeneously. By adopting this structure, it is possible to develop the effect that the display is not adversely affected even if a space is formed between the partition wall and the outer sealing wall.

By making the internal filling portion of the material which has a visible light transmittance of 50% or higher to the light of a wavelength of 400 to 800 nm and a refractive index of 1.2 to 2.5, moreover, the emitted light of the organic EL layer can pass through the color conversion filter layer efficiently.

While the invention has been explained with reference to the specific embodiments of the invention, the explanation is illustrative and the invention is limited only by the appended claims.

What is claimed is:

1. A method for producing an organic EL display, comprising the steps of:
    preparing an organic EL light emitting element by forming a first electrode, an organic EL layer and a second electrode on a substrate,
    preparing a color conversion filter by forming a color conversion filter layer on a transparent substrate,
    forming a partition wall by using a photosensitive photoresist around a periphery of the color conversion filter layer,
    forming an outer sealing wall by using an ultraviolet setting adhesive at an outer side of the partition wall,
    filling an inside of the partition wall with a filler,
    adhering the organic EL light emitting element and the color conversion filter while aligning with each other, and
    curing the outer sealing wall.

2. A method for producing an organic EL display according to claim 1, wherein in the step of preparing the color conversion filter, a flattening layer is also formed on the color conversion filter layer, said partition wall being formed outside a display region of the flattening layer.

3. A method for producing an organic EL display according to claim 1, wherein the steps of preparing the color conversion filter layer, forming the flattening layer, forming the partition wall on the flattening layer, forming the outer sealing wall and filling the inside with the filler are conducted separately from the step of preparing the organic EL light emitting element, and then, the organic EL light emitting element and the color conversion filter with the filler therein are aligned and adhered in the adhering step.

4. A method for producing an organic EL display according to claim 1, wherein in the step of preparing the organic EL light emitting element, a thin film transistor is formed on the substrate to be connected to the first electrode.

5. A method for producing an organic EL display according to claim 1, wherein in the step of preparing the organic EL light emitting element, said first electrode is formed in a first line pattern and said second electrode is formed in a second line pattern extending perpendicular to the first line pattern.

6. A method for producing an organic EL display according to claim 1, wherein said filler has a refractive index of 1.2 to 2.5 and a visible light transmittance of 50% or higher relative to light having a wavelength of 400 to 800 nm.

7. A method for producing an organic EL display according to claim 1, wherein the steps of preparing the color conversion filter layer, forming the partition wall, forming the outer sealing wall and filling the inside with the filler are conducted separately from the step of preparing the organic EL light emitting element, and then, the organic EL light emitting element and the color conversion filter with the filler therein are aligned and adhered in the adhering step.

8. A method for producing an organic EL display, comprising the steps of:
    preparing an organic EL light emitting element by forming a first electrode, an organic EL layer and a second electrode on a substrate,
    preparing a color conversion filter by forming a color conversion filter layer on a transparent substrate,
    forming a partition wall by using a photosensitive photoresist around a periphery of the organic EL light emitting element,
    forming an outer sealing wall by using an ultraviolet setting adhesive at an outer side of the partition wall,
    filling an inside of the partition wall with a filler,
    adhering the organic EL light emitting element and the color conversion filter while aligning with each other, and
    curing the outer sealing wall.

9. A method for producing an organic EL display according to claim 8, wherein in the step of preparing the organic EL light emitting element, a thin film transistor is formed on the substrate to be connected to the first electrode.

10. A method for producing an organic EL display according to claim 8, wherein said first electrode is formed in a first line pattern and said second electrode is formed in a second line pattern extending perpendicular to the first line pattern.

11. A method for producing an organic EL display according to claim 8, wherein said filler has a refractive index of 1.2 to 2.5 and a visible light transmittance of 50% or higher relative to light having a wavelength of 400 to 800 nm.

12. A method for producing an organic EL display according to claim 8, wherein the steps of preparing the organic EL light emitting element, forming the partition wall, forming the outer sealing wall and filling the inside with the filler are conducted separately from the step of preparing the color conversion filter layer, and then, the organic EL light emitting element with the filler therein and the color conversion filter are aligned and adhered in the adhering step.

* * * * *

UNITED STATES PATENT AND TRADEMARK OFFICE
CERTIFICATE OF CORRECTION

PATENT NO. : 6,897,087 B1
DATED : May 24, 2005
INVENTOR(S) : Katsuhiko Yanagawa et al.

It is certified that error appears in the above-identified patent and that said Letters Patent is hereby corrected as shown below:

Column 10,
Line 13, change "photo/" to -- photo-/ --.

Column 19,
Line 64, change "cliam 1" to -- claim 2 --.

Signed and Sealed this

Twenty-seventh Day of September, 2005

JON W. DUDAS
*Director of the United States Patent and Trademark Office*